(12) United States Patent
Aizawa et al.

(10) Patent No.: US 6,639,248 B2
(45) Date of Patent: Oct. 28, 2003

(54) LIGHT EMITTING AND RECEIVING DEVICE STRUCTURE

(75) Inventors: Hidekuni Aizawa, Kanagawa (JP);
Tamiaki Matsuura, Kanagawa (JP);
Shigeru Shinzawa, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/187,534

(22) Filed: Jul. 2, 2002

(65) Prior Publication Data

US 2003/0038290 A1 Feb. 27, 2003

(30) Foreign Application Priority Data

Jul. 5, 2001 (JP) ........................................ 2001-204406

(51) Int. Cl.$^7$ ...................... H01L 27/15; H01L 31/0232
(52) U.S. Cl. ............................... 257/82; 257/80; 257/81; 257/84; 257/98; 257/99; 257/432
(58) Field of Search ............................... 257/79, 80, 81, 257/82, 84, 98, 99, 432, 433, 434; 250/216

(56) References Cited

U.S. PATENT DOCUMENTS 5,130,531 A * 7/1992 Ito et al. ...................... 250/216

FOREIGN PATENT DOCUMENTS

| JP | 04-503127 | 6/1992 |
|----|-----------|--------|
| JP | 05-342396 | 12/1993 |

* cited by examiner

*Primary Examiner*—Minh Loan Tran
*Assistant Examiner*—Tan Tran
(74) *Attorney, Agent, or Firm*—Sonnenschein, Nath & Rosenthal LLP

(57) ABSTRACT

A light emitting and receiving device structure capable of compactly accommodating a light emitting element and a light receiving element and having an optical axis of an emitted beam of light in close proximity to an optical axis of a return beam of light to produce the light emitting and receiving device in a miniature size and lightweight. A one-piece structure consists of a cylindrical package having a bottom with its one end open and the other end closed with a bottom plate and a protruding pedestal member which is installed on the bottom plate of the package with its centerline concentric with the centerline of the package. The light receiving element is secured to the front end surface of the pedestal member, while the light emitting element is secured to the side face of the pedestal member, thus accommodating both devices in one package.

4 Claims, 4 Drawing Sheets

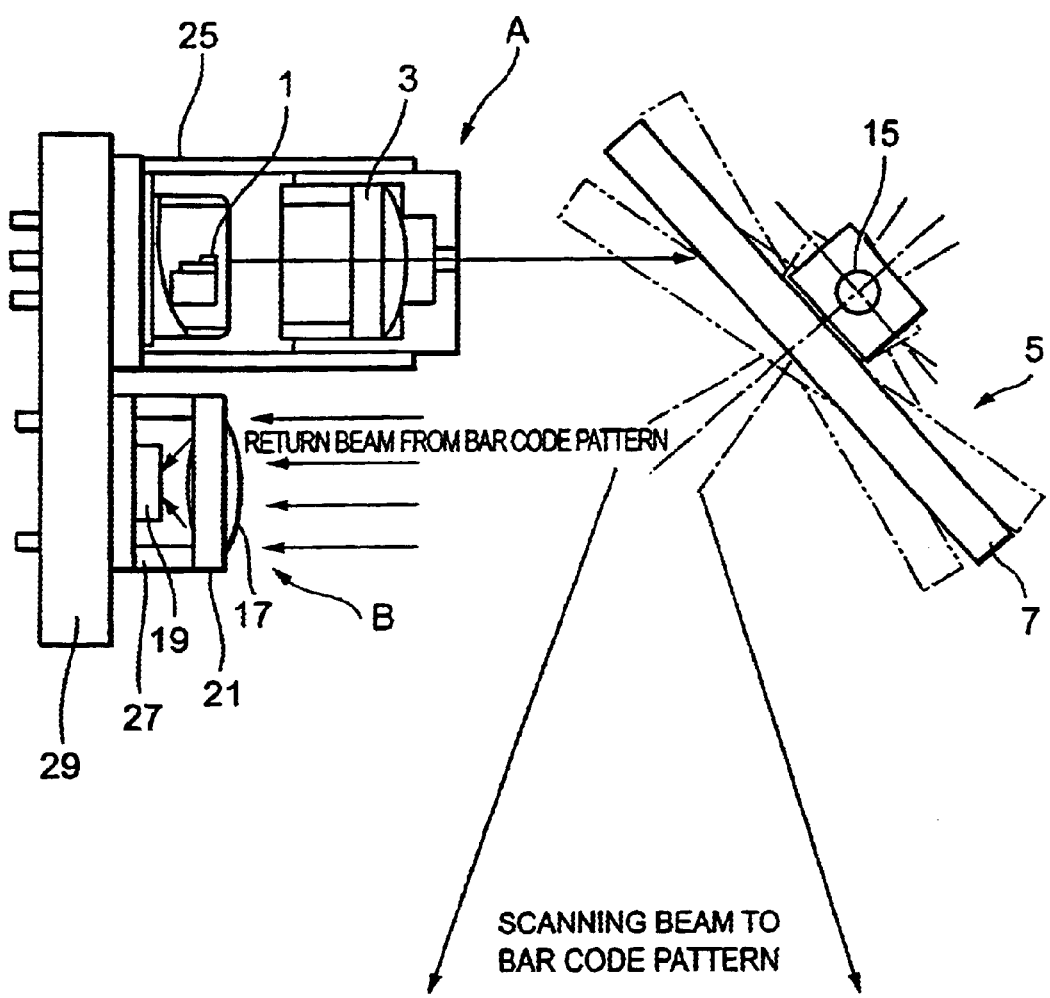

LIGHT EMITTING AND RECEIVING DEVICE STRUCTURE

CROSS REFERENCES TO RELATED APPLICATIONS

The present document is based on Japanese Priority Document JP 2001-204406, filed in the Japanese Patent Office on Jul. 5, 2001, the entire contents of which being incorporated herein by reference.

BACKGROUND OF THE INVENTION

1. Field of the Invention

The present invention relates to a light emitting and receiving device structure suitably employed in an optical apparatus for bar code reading, and more particularly to improvement techniques which enable miniaturization and lightweight of such device structure to be achieved by adjusting arrangement of a light emitting element and a light receiving element.

2. Description of the Related Art

Recently, a great many stores, shops, factories and the like put bar codes on their goods and products for sales control and production management. The bar codes, each representing digital information, are read by optical scanning. In general, by irradiating beams of light to the bar codes and subjecting the intensity of reflected beams of light to photoelectric conversion, this type of bar code provides information from a combination of detected signals therefrom.

Namely, as shown by a conceptual representation in FIG. 5, a beam of light from a light emitting element 1 is focused through an iris of a light projection lens 3, and the beam of light thus obtained is reflected off a mirror 7 of a scan mirror 5 to irradiate a bar code pattern 9 which is a target of irradiation. Since the beam of light is irradiated over the entire area of the bar code pattern 9, the mirror 7 is oscillated. The oscillation occurs as follows: by fitting a magnet 11, which is attached to the mirror 7, into a drive coil 13, for example, positive and negative current is applied to the drive coil 13 at a constant period, then the magnet 11 is attracted to and repelled from the drive coil 13, thus causing the mirror 7 to oscillate relative to an oscillating fulcrum point 15 as its fulcrum.

On the other hand, the beam of light irradiated on the surface of the bar code pattern 9, despite undergoing irregular reflection, returns to the mirror 7 again through changes in the quantity of light due to the black and white of the bar code pattern. Then, the beam of light reflected there is condensed by a condenser lens 17, changes in the quantity of light being electrically converted by a light receiving element 19 and outputted. It should be noted that for the sake of increasing the reading accuracy, a band pass filter (BPF) is set up in front of the light receiving element 19 to prevent admitting unnecessary beams of light other than those beams of the light emitting optical frequency.

A light emitting and receiving device for bar code reading shown in FIG. 6 is available as a conventional apparatus which is constructed in accordance with the above-mentioned bar code reading method. The light emitting and receiving device is, as illustrated, configured by a light emitting assembly A incorporating a light emitting element 1 and a light projection lens 3 in a housing 25 and a light receiving assembly B incorporating a light receiving element 19 and a light receiving lens 17, and a BPF 21 in a housing 27. Both assemblies are mounted on a substrate 29. Electrical connections in each of the housing 25 and the housing 27 are performed by wire bonding or other methods, and the mirror 7 of the scan mirror 5 is so arranged as to enable oscillation relative to the oscillation fulcrum point 15. Further, these light emitting assembly A, light receiving assembly B, and scan mirror 5 are accommodated in a frame not illustrated to form a light emitting and receiving device for bar code reading.

Nevertheless, since the light emitting and receiving device for bar code reading comprises the light emitting assembly with the light emitting element and the light projection lens accommodated in a casing separately from the light receiving assembly B with the light receiving element and the light receiving lens accommodated in another casing, there are a large number of parts. In addition, because the light emitting element and the light receiving element need to be juxtaposed facing a target of irradiation, a gap occurs between the packages to necessitate a large installation space, setting limits to achieving miniaturization and light weight of the entire light emitting and receiving device.

On the other hand, miniaturization may be conceivably accomplished by juxtaposing and incorporating the light emitting element and the light receiving element in a single package, while, on the other hand, an area due to package duplication can be dispensed with by constructing an integral, one-piece package, but the need to secure the spaces for mounting the light emitting element and the light receiving element on the same plane yet remains, thus making it impossible to accomplish sufficient miniaturization.

Further, in a case of juxtaposing the light emitting element and the light receiving element on the same plane, the optical axis of an emitted beam of light cannot be placed in close proximity to the optical axis of a return beam of light, so that the light projection lens is disposed on the outside face of the light receiving lens, contributing to enlarging a space occupied by the optical system—another detriment to achieving miniaturization and light weight of the light emitting and receiving device.

SUMMARY OF THE INVENTION

The present invention is directed to solving these drawbacks, and provides a light emitting and receiving device structure which can place an optical axis of an emitted beam of light in close proximity to an optical axis of a return beam of light, thereby accomplishing the miniaturization and light weight of the light emitting and receiving device.

A light emitting and receiving device structure according to a first aspect of the present invention comprises a cylindrical package having a bottom with an opening on one end and the other end closed, and a pedestal member concentric with a center line of the package and protrudingly disposed on a bottom plate in the package. In the device structure, the light receiving element is secured to a front end surface of the pedestal member and the light emitting element is secured to a side face of the pedestal member, so that the light emitting element and the light receiving element are both accommodated in the same package.

In the light emitting and receiving device structure, each surface (the front end surface and the side face) of the cubic pedestal member protrudingly disposed on the bottom plate of the package is utilized for a space of mounting each element; for example, as compared with a structure of juxtaposing a light emitting element and a light receiving element on the bottom plate, the present arrangement can provide high-density accommodation by making an outer diameter of the package small. Namely, the miniaturization of the package becomes possible.

Further, through this structure of element arrangement in this manner, it is possible to place an optical axis of an emitted beam of light in close proximity to an optical axis of a return beam of light, enabling a light projection lens to be easily placed on a region of the light receiving lens, whereby a medium is jointly used (made possible by a one-piece light projection and receiving lens with the formation of a light projection lens element on a part of the light receiving lens) to enable an optical system to be made lightweight.

A light emitting and receiving device structure according to a second aspect of the present invention comprises a strip of light emitting element of having a light emitting unit on an end surface and irradiating a beam of light emitted from the light emitting unit to a target of irradiation; a strip of light receiving element of having a light receiving face on a surface thereof and receiving a return beam of light from the target of irradiation on the light receiving face; a cylindrical package having a bottom with an opening on one end and the other end closed by a bottom plate; and a pedestal member protrudingly disposed on the bottom plate in the package in such a manner as to be concentric with the center line of the package. In the device structure, the light receiving element is secured to the front end surface of the pedestal member so that the light receiving face looks towards the opening and the light emitting element is secured to the side face of the pedestal member so that the light emitting unit looks towards the opening.

In the light emitting and receiving device structure having been described, in addition to its space-saving feature, the orthogonal surfaces (the front end surface and the side face) of the cubic pedestal member protrudingly disposed on the bottom plate of the package are put to effective use as the spaces of mounting the elements to enable respective strips of light emitting element and light receiving element to be placed at right angles relative to each other, whereby, for example, as compared with a conventional structure of juxtaposing the light emitting element and the light receiving element on one bottom plate, an outer diameter of a package can be made small to provide for high-density accommodation, that is, enabling the package to be made compact.

Further, the configuration of the devices in this way makes it possible to place an optical axis of an emitted beam of light in close proximity to an optical axis of a return beam of light, hence, the light projection lens can be arranged on the region of the receiving light lens, whereby a medium can be jointly used to enable the optical system to be made light weight.

The light emitting and receiving device structure according to a third aspect of the present invention comprises an one-piece light projection and receiving lens having a light projection lens unit formed on a part of the light receiving lens unit, which is secured to the opening of the package.

In the light emitting and receiving device structure, the light receiving lens unit of the one-piece light projection and receiving lens is fitted into the entire opening of the package, the light projection lens unit being formed on a part of the light receiving lens unit, thereby making it possible to converge the emitted beam of light and the return beam of light even in the high-density device configuration. In the device structure, an optical axis of the emitted beam of light is placed in close proximity to an optical axis of the return beam of light. Further, the light projection lens can be set up in a space for setting up the light receiving lens, and the space for setting up the optical system becomes smaller by dispensing with a space which would otherwise be required therefor. In addition, the weight becomes lighter.

The light emitting and receiving device structure according to a fourth aspect of the present invention includes the pedestal member composed of a heat sink.

In the light emitting and receiving device structure, since the pedestal member is composed of the heat sink, the pedestal member has a dual function as a pedestal for cubic arrangement of the light emitting element and the light receiving element and as means for cooling the devices, thus realizing an advanced function (additional cooling function) while maintaining its miniature size.

The light emitting and receiving device structure according to a fifth aspect of the present invention comprises a plurality of leads that extend through the bottom plate and protrude in a ring space between an outer circumference of the pedestal member and an inner circumference of the package, respective leads being connected to electrodes of the light emitting element and the light receiving element.

In the light emitting and receiving device structure, by placing the pedestal member protrudingly on the bottom plate, the ring space is formed between the inner circumference of the package and the outer circumference of the pedestal member. By letting the plurality of leads that extend through the bottom plate protrude into the ring space, the leads can be placed at any position in the circular direction, thus making effective use of the ring space possible. This allows electrical connections while maintaining the miniaturization of the package without providing for a space exclusively for lead connections.

In accordance with the light emitting and receiving device structure of the present invention, the pedestal member is protrudingly disposed on the bottom plate of the cylindrical package having a bottom, the light receiving element being secured to the front end surface of the pedestal member and the light emitting element being secured to the side face of the pedestal member, hence, as compared with a case of using each surface (the front end surface and the side face) of the cubic pedestal member for a space of mounting each device, for example, juxtaposing the light emitting element and the light receiving element on the bottom plate of the package, the outer diameter of the package is made small to enable high-density accommodation. Namely, it is possible to make a compact structure, hence the package can be made smaller. Use of the structure for disposing the devices in this manner makes it possible to place the optical axis of the emitted beam of light in close proximity to the optical axis of the return beam of light, and the light projection lens can be disposed on the region of the light receiving lens, whereby it is possible to produce an one-piece light emitting and light receiving structure jointly using a medium, resulting in the lightweight light emitting and receiving device.

BRIEF DESCRIPTION OF THE DRAWINGS

Other objects, advantages, and capabilities of the present invention will become more apparent as the description proceeds taken in conjunction with the accompanying drawings which:

FIG. 6 is a sectional view of a conventional light emitting and receiving device for bar code reading.

DETAILED DESCRIPTION OF THE PREFERRED EMBODIMENT

Preferred embodiments of a light emitting and receiving device structure according to the present invention will be described with reference to the accompanying drawings.

Figure 1:
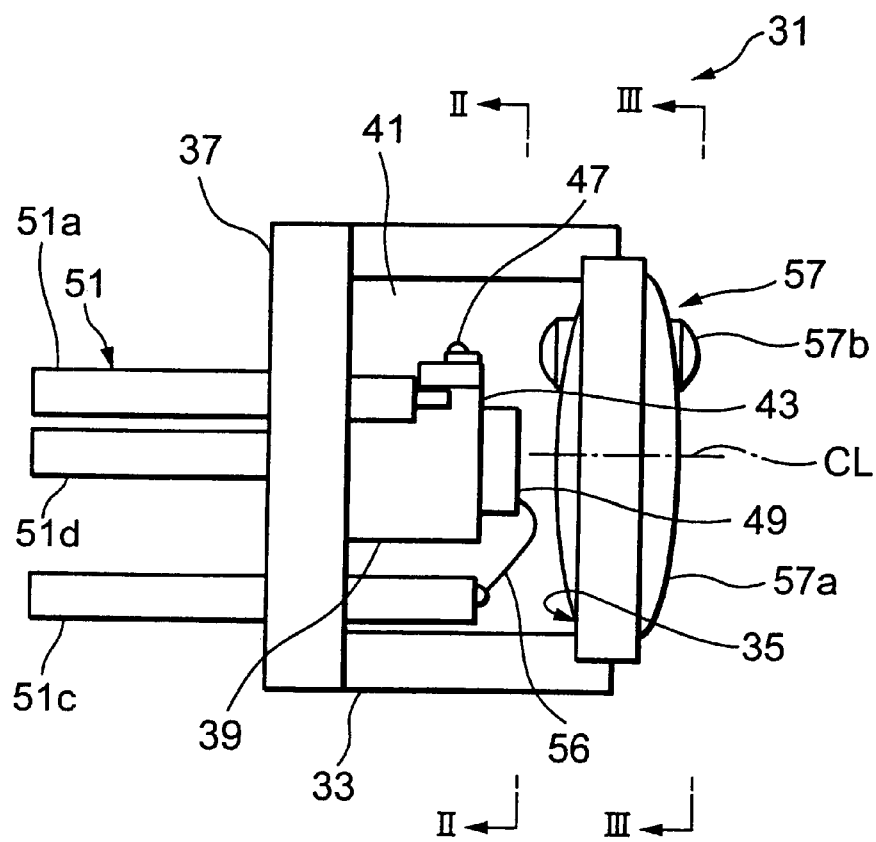
FIG. 1 is a sectional view of a light emitting and receiving device structure according to the present invention.
Figure 2:
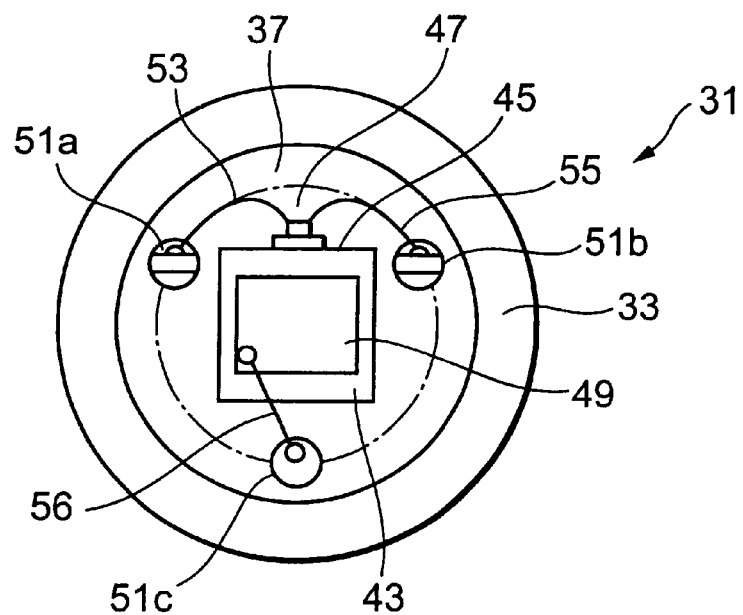
FIG. 2 is a view taken on line II—II of FIG. 1.
Figure 3:
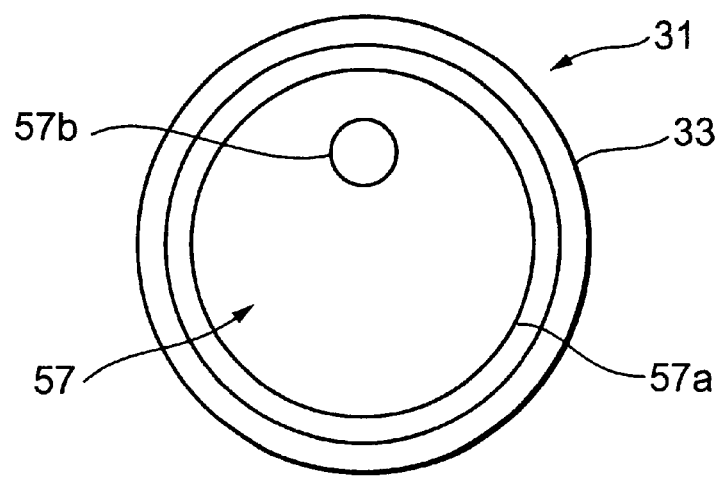
FIG. 3 is a view taken on line III—III of FIG. 1.

As shown in FIG. 1, a light emitting and receiving device 31 having a light emitting and receiving device structure of the present embodiment comprises a package 33, exterior shell of which is formed of a synthetic resin. The package 33 is cylindrical with a bottom and has an opening 35 at one end thereof in the CL direction of the center line and a bottom plate 37 closing the other end thereof (so-called "can type package").

On the bottom plate 37 in the package 33, there is protrudingly disposed a pedestal member in the shape of an angular pole concentric with the center line CL of the package 33. In the present embodiment, the pedestal member is a heat sink 39 for cooling a light emitting element as well as a light receiving element to be described later. The heat sink 39 may be in other shape than an angular pole, such as a circular cylinder. The heat sink 39 is constituted by copper having good thermal conductivity, mainly eliminating heat generated from the light emitting element due to consecutive light emission.

The heat sink 39, by being positioned concentric with the center line CL of the package 33, forms a ring space 41 between the outer circumference and the inner circumference of the package 33, also its front end surface 43 forming an orthogonal surface relative to the center line CL of the package 33, and its side face 45 constituting a parallel surface relative to the center line CL. Namely, the front end surface 43 and the side face 45 are orthogonal surfaces.

On the side face 45 of the heat sink 39 is fixedly mounted a strip of light emitting element 47; also, on the front end surface 43 of the heat sink 39 is fixedly mounted a strip of light receiving element 49. The light emitting element 47 has a light emitting unit on the end surface (orthogonal to the surface), from which a beam of light is emitted to irradiate a target of irradiation, while the light receiving element 49 has a light receiving face on a surface thereof for receiving a return beam of light from the target of irradiation.

The light emitting element 47 is fixedly mounted on the side face 45 so as to position the light emitting unit thereof looking towards the opening 35, and the light receiving element 49 is fixedly mounted on the front end surface 43 so as to position the light receiving face looking towards the opening 35. Namely, the light emitting element 47 and the light receiving element 49 are such that the light emitting unit and the light receiving face are installed at a right angle to each other, both being accommodated in the package 33.

This arrangement enables a beam of light emitted from the light emitting element 47 to be directly received by the light receiving element 49 on the heat sink 39 without requiring angular conversion of 90 degrees via a mirror or a prism. In accordance with the present embodiment, since the pedestal member is formed of the heat sink 39, the pedestal member has a dual function as a pedestal for cubic disposition of the light emitting element 47 and the light receiving element 49 and as means for cooling the devices, bringing about an advanced function (additional cooling function) while maintaining the miniature size.

It should be pointed out that the shapes of the light emitting element 47 and the light receiving element 49 are not limited to the shape of a strip but can be any other shape, provided that, in a case of a different shape, too, its maximum surface must be secured in a posture parallel to the "surface" as described in the embodiment according to the present invention. Namely, the light emitting element 47 having its light emitting unit on the end surface is secured so that its maximum surface is parallel to the side face 45, and the light receiving element 49 having its light receiving face on its maximum surface is secured so that its maximum surface is parallel to the front end surface 43. This arrangement makes it possible for the devices to be mounted by making effective use of the orthogonal surfaces of the cubic heat sink 39.

Further, in the present embodiment, a monitoring PD (photodiode) not illustrated is provided on the side face in the vicinity of the light emitting element 47, functioning to receive a beam of light from the light emitting element 47 and transmitting its detection signal so as to control the laser output of the light emitting element 47 to a preset level. The monitoring PD is set up in lamination with the light emitting element 47 or on an opposite side face of the light emitting unit.

In the ring space 41, a plurality (four (4) in the present embodiment) of leads 51 (51a, 51b, 51c, and 51d) extending through the bottom plate 37 protrude and an electrode of the light emitting element 47 is connected with a bonding wire 53 to the end surface of the lead 51a. An electrode of the monitoring PD is connected with a bonding wire 55 to the end surface of the lead 51b. An electrode of the light receiving element 49 is connected by a bonding wire 56 to the end surface of the lead 51c. Also, the heat sink 39 is connected to the lead 51d.

In this manner, by jutting out the plurality of leads 51 extending through the bottom plate 37 into the ring space 41, the leads 51 can be disposed at any position in the circular direction thus to make it possible to use the ring space 41 effectively. As a result, it is not necessary to provide an exclusive space for lead connections, and electrical connections can be made while maintaining the package 33 in a miniature size.

A one-piece light projection and receiving lens 57, which is fitted into the opening 35 of the package 33, comprises a light receiving lens unit 57a and a light projection lens unit 57b which is formed on a part of the light receiving lens unit 57a. The one-piece light projection and receiving lens 57 is integrally formed of these light projection lens unit 57a and light emitting lens unit 57b by using the same medium, for example, a transparent resin material (polycarbonate or the like).

Use of the one-piece light projection and receiving lens having the light projection lens unit 57b formed on a part of the light receiving lens unit 57a enables an emitted beam of light and a return beam of light to be converged even in a high-density device arrangement structure which places the optical axis of the emitted beam of light in close proximity to the optical axis of the return beam of light. This arrangement makes it possible for the light projection lens unit 57b to be disposed within the mounting space of the light receiving lens unit 57a in the light projection and receiving device 31, so that a space for mounting the optical system is reduced.

Figure 4:
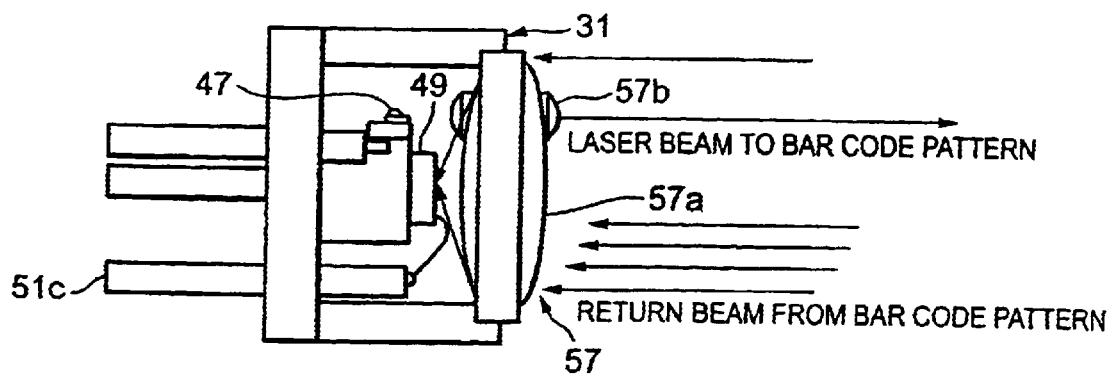
FIG. 4 is an explanatory diagram of operation of the light emitting and receiving device in FIG. 1.
Figure 5:
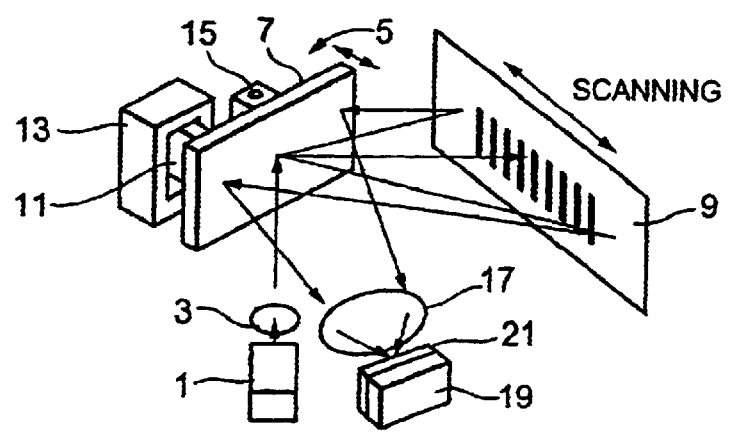
FIG. 5 is a schematic diagram explaining a conventional optical reading method.

Next, the operation of the light emitting and receiving device 31 having the structure which have been explained will be described with reference to FIG. 4 which is a diagram explaining the operation of the light emitting and receiving device of FIG. 1.

In the light emitting and receiving device 31, a beam of light from the light emitting element 47 is converged by the light projection lens unit 57b of the one-piece light projection and receiving lens 57 and emitted. Then, the beam of light reflects off a mirror of a scan mirror not illustrated and irradiates a bar code pattern not shown.

Through changes in the quantity of light caused by the black and white of the bar code pattern, a beam of light irradiated on a bar code pattern surface, despite reflecting irregularly, again, returns to the mirror. The beam of the light reflected off the mirror enters the light receiving lens unit 57a of the one-piece light projection and receiving lens 57. The return beam of light entering the light receiving lens unit 57a is converged and received by the light receiving element 49. This beam of light is subjected to photoelectric conversion by the light receiving element 49 to process the bar code pattern as an electrical signal which is outputted to the lead 51c, then the output signal is transmitted to a computer not shown, and processed, so that the bar code information is decoded.

According to the light emitting and receiving device structure having been described, by using the light emitting element 47 having the light emitting unit on the end surface and the light receiving element 49 having the light receiving face on the surface, the light receiving element 47 is secured to the front end surface 43 of the heat sink 39 so that the light receiving face looks towards the opening 35, and the light emitting element 47 is secured to the side face 45 of the heat sink 39 so that the light emitting unit looks towards the opening 35, whereby the orthogonal surfaces (the front end surface 43 and the side face 45) of the cubic heat sink 39 protrudingly disposed on the bottom plate 37 of the package 33 are put to effective use for the spaces of mounting the devices to enable respective strips of light emitting element 47 and light receiving element 49 to be respectively disposed orthogonally. Namely, using each surface of the heat sink 39 for the space for mounting the elements, for example, as compared with a structure of juxtaposing the light emitting element and the light receiving element on the bottom plate, the outer diameter of the package is reduced to enable high-density accommodation.

Further, by employing the structure for disposing the devices in this manner, an optical axis of an emitted beam of light and an optical axis of a return beam of light can be placed in close proximity to each other, so that the light projection lens unit 57b can be disposed on the region of the light receiving lens unit 57a, whereby joint use of the medium (that is, by creating the one-piece light projection and receiving lens 57 having the light projection lens unit 57b formed on a part of the light receiving lens unit 57a) makes it possible to produce a lightweight optical system.

While a preferred embodiment has been described, variations and modifications will occur to those skilled in the art within the scope of the present inventive concepts which are delineated by the following claims.

What is claimed is:

1. A light emitting and receiving device structure comprising:
   a cylindrical package with a bottom, one end thereof having an opening and another end thereof being closed by a bottom plate; and
   a pedestal member concentric with a center line of the package being protrudingly disposed on said bottom plate,
   wherein,
      a light receiving element is secured to a front end surface of said pedestal member,
      a light emitting element is secured to a side face of said pedestal member,
      both said light emitting element and said light receiving element are incorporated in said package, and
      a one-piece light projection and receiving lens having a light projection lens unit formed on a part of a light receiving lens unit is secured to said opening of said package.

2. A light emitting and receiving device structure comprising:
   a strip of light emitting element having a light emitting unit on an end surface and irradiating a beam of light emitted by said light emitting unit to a target of irradiation;
   a strip of light receiving element having a light receiving face on a surface thereof and receiving return beam of light from said target of irradiation on said light receiving face;
   a cylindrical package with a bottom, one end thereof having an opening and another end thereof being closed by a bottom plate; and
   a pedestal member concentric with a center line of said package being protrudingly disposed on said bottom plate inside the package,
   wherein,
      said light receiving element is secured to a front end surface of said pedestal member so that said light receiving face looks towards said opening,
      said light emitting element is secured to a side face of said pedestal member so that said light emitting unit looks towards said opening, and
      a one-piece light projection and receiving lens having a light projection lens unit formed on a part of a light receiving lens unit is secured to said opening of said package.

3. The light emitting and receiving device structure according to any one of claim 1 and 2, wherein raid pedestal member comprises a heat sink.

4. The light emitting and receiving device structure according to any one of claim 1 and 2, wherein a plurality of leads extended through said bottom plate protrude in a ring space between an outer circumference of said pedestal member and an inner circumference of said package, said leads being, respectively, connected to electrodes of said light emitting element and said light receiving element.

* * * * *